(12) United States Patent
Hatano

(10) Patent No.: US 6,211,564 B1
(45) Date of Patent: Apr. 3, 2001

(54) INTEGRATED CIRCUIT PACKAGE HAVING STEPPED TERMINALS

(75) Inventor: Hiromitsu Hatano, Tokyo (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 09/209,464

(22) Filed: Dec. 11, 1998

(30) Foreign Application Priority Data

Dec. 11, 1997 (JP) .................................................. 9-341085

(51) Int. Cl.[7] .......................... H01L 23/04; B29C 45/26; H05K 7/20
(52) U.S. Cl. .......................... 257/686; 257/685; 257/723; 257/696; 257/693; 257/692; 257/698; 257/666; 257/712; 257/675; 257/713; 361/719; 174/52.4
(58) Field of Search .................................... 257/666, 678, 257/685, 686, 692, 693, 696, 698, 723, 730, 675, 707, 706, 712, 713, 717, 720, 777, 796; 361/719, 813, 773; 174/52.4

(56) References Cited

U.S. PATENT DOCUMENTS

| 5,323,060 | * | 6/1994 | Fogal et al. ........................... 257/777 |
|---|---|---|---|
| 5,386,343 | * | 1/1995 | Pao ........................................ 257/686 |
| 5,754,408 | * | 5/1998 | Derouiche ............................. 257/686 |
| 5,790,378 | * | 8/1998 | Chillara ................................ 257/675 |
| 5,824,950 | * | 10/1998 | Mosley et al. ........................ 257/678 |
| 5,844,177 | * | 1/1999 | Sundstrom ............................ 257/723 |
| 5,910,685 | * | 6/1999 | Watanabe et al. .................... 257/777 |
| 6,005,778 | * | 12/1999 | Spielberger et al. ................. 257/686 |
| 6,051,886 | * | 4/2000 | Fogal et al. ........................... 257/777 |

FOREIGN PATENT DOCUMENTS 6-61363    3/1994   (JP) .

* cited by examiner

Primary Examiner—Alexander O. Williams
(74) Attorney, Agent, or Firm—Oblon, Spivak, McClelland, Maier & Neustadt, P.C.

(57) ABSTRACT

An integrated circuit package is configured to host an electric circuit chip therein and have connected thereto a set of external terminals that provide electrical connections between the electric circuit chip and components that are external to the integrated circuit package. The set of external terminals is arranged in subsets, where each subset includes a predetermined number of external terminals that are arranged in a stepped configuration, so as to reduce an overall size of the integrated circuit package.

7 Claims, 2 Drawing Sheets

INTEGRATED CIRCUIT PACKAGE HAVING STEPPED TERMINALS

BACKGROUND OF THE INVENTION

1. Field of the Invention

The present invention is related to integrated circuits (IC) having external terminals. More particularly, the present invention is directed to IC packages that hold an integrated circuit (i.e., electronic circuit chip) therein that is electrically connected to terminals of the IC package that extend outside of the package, and are thus termed external terminals, which are formed in plural steps. The plural steps of external terminals reduces the required area (i.e., footprint) required to support the IC package on a circuit board.

2. Discussion of the Related Art

One type of IC package is described in Japanese Unexamined Patent Publication (KOKAI) No. 6-61363. This IC package attempts to prevent the external terminals of the IC package from being transformed in shape during ordinary use, by locating the wide portions of the external terminals in a hounds-tooth configuration so as to keep limited clearance between the respective terminals.

Electric circuit chips may be reduced in area by way of improvements in semiconductor manufacturing processes. However, simply by reducing the size of the chip does not solve a problem regarding how to package the chip in a configuration that provides terminals that may be easily electrically and physically connected to circuit boards. A limitation with the package itself regards the lead pitch (i.e., the relative spacing between external terminals) in order to meet manufacturing tolerances, physical restrictions on board use, and electrical considerations regarding isolation between the terminals. Thus, even if further reductions in chip size are possible, when the chips are placed within the package the overall package size is not necessarily reduced because the pitch of the external pins for the package limits the overall footprint of the device.

Some packages such as Quad Flat Package (QFP) have a feature that allows pin pitch to be 0.4 mm, as a limit generally. Accordingly, in these configurations, even though the chip size is reduced, the overall package size once again is limited by the pin pitch, commonly restricted to 0.4 mm. In products that require a large number of external pins, there is the distinct possibility that the size of the package will be 10 times as large as the chip itself (when comparing the respective footprints of the chip and the package).

FIG. 2 is an example of a conventional package and chip, which is viewed from a top view. A pitch of the external terminals in this case is required to be more than 0.4 mm and as a general rule for manufacturing and reliability purposes cannot be less than 0.4 mm. Accordingly, the size of this package 12, as shown in FIG. 2, is larger than the internal chip 10, and the distance between the package 12 and the chip 10 results in a significant amount of useless space around the chip that takes up perhaps valuable real estate on a circuit board. Conventional approaches have not adequately addressed this problem, as determined by the present inventor.

Moreover, using conventional techniques, it has not been possible for the overall IC package to be reduced in size due to a requirement of maintaining a minimum lead pitch. However, with more complex chips that require additional external pins, the overall package size of products has been increasing, yet the amount of real estate allocated for more modern IC components is being reduced as modern electronic are generally shrinking in size.

SUMMARY OF THE INVENTION

An object of the present invention is to address the above-mentioned and other problems associated with integrated circuits having a plurality of external terminals.

A characteristic feature of the present invention is an IC package with external terminals having plural "steps" arranged in a multi-layered architecture. Using the multi-layer arrangement of external terminals, it is possible to solve the conventional problem and reduce the overall package size so as to maintain a significant efficiency between the difference in chip area and IC package area. By implementing the stepped feature of the present invention it is possible to raise the efficiency of the chip itself in the package, by efficient connection of the terminal so as to reduce heat and noise in the package itself and reduce the overall thickness of the package, relative to a modular type IC package that holds multiple chips therein.

Accordingly, a feature of the present invention is an IC package having external terminals arranged in sets of plural steps, having a common pitch. Another feature is an IC package that holds more than one electric circuit chips therein and having external terminals arranged in plural steps, where the external terminals connect to the respective electric circuit chips inside of the IC package. A further feature of the present invention is the inclusion of a radiation plate that helps suppress noise within the IC package and being connected with a portion of the external terminals, that portion not being connected to the electric circuit chips inside of the IC package. These external terminals may be connected to the chips and plate by way of wire bonding, or use of an electric adhesive.

Advantages of the present invention, and particularly using the arrangement of plural steps for the external terminals is that the overall package size and total volume of the IC package is reduced. An efficient use of the external terminals is an advantage of connecting the external terminals to more than one chip within the IC package. Using the plate offers the possibility of reducing electric noise, which if not suppressed gives rise to electric signal disturbances. A second advantage of using a plate is that is able to radiate heat from the package, where the heat itself is generated by the chips within the IC package. Wire bonding for connecting the external terminals to the chips makes it possible to efficiently conduct electric signals and heat through wires in a convenient, manufacturable way. With regard to the electric adhesive, the electric adhesives allow for thickness reduction of the overall package, thereby giving rise to the possibility of including more chips within the IC package.

BRIEF DESCRIPTION OF THE DRAWINGS

A more complete appreciation of the present invention and many of the attendant advantages thereof will be readily obtained as the same becomes understood by reference to the following detailed description when considered in connection with the accompanying drawings, wherein:

FIG. 1(*b*) is a partial perspective view of the IC package with external terminals arranged in plural steps in accordance with the first embodiment of the present invention.

DESCRIPTION OF THE PREFERRED EMBODIMENTS

Figure 1A:
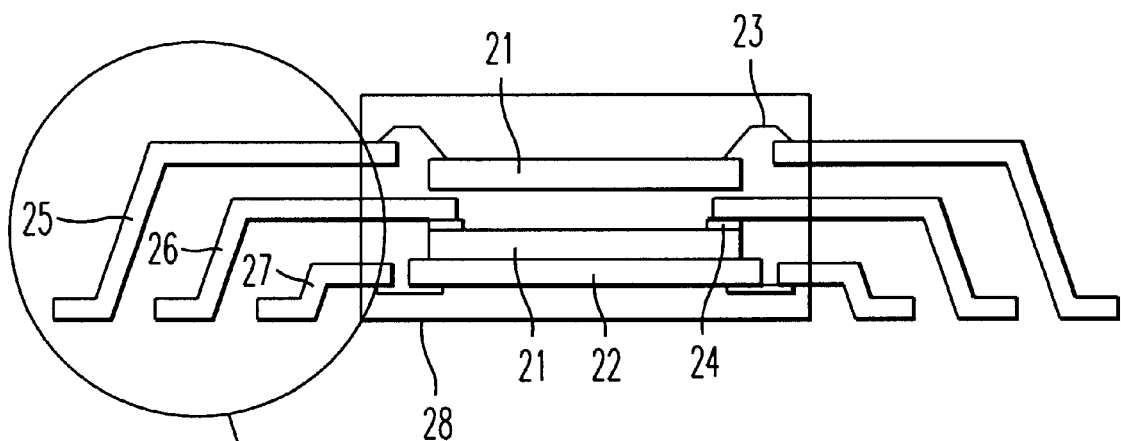
FIG. 1(*a*) is a sectional side view of an IC package with external terminals arranged in plural steps in accordance with a first embodiment of the present invention.
Figure 1B:
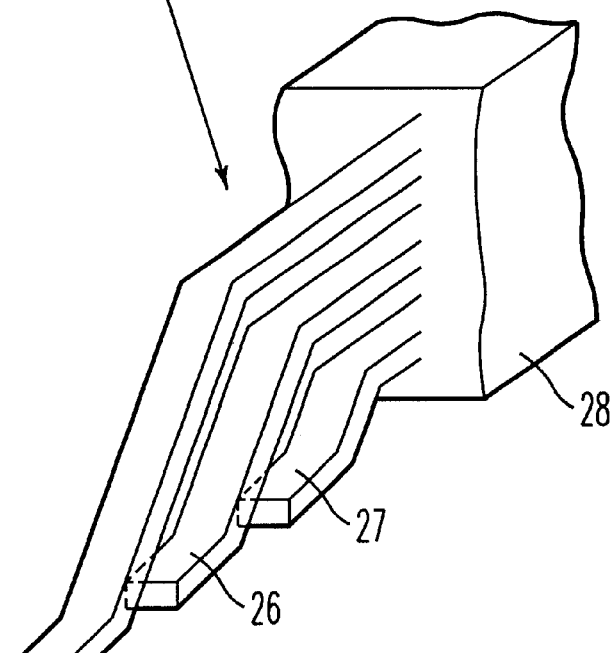

Referring now to the drawings, wherein like reference numerals are used to describe the same or corresponding parts throughout the several views, and more particularly to FIG. 1(*a*) thereof, FIG. 1(*a*) is a sectional side view of an IC package with external terminals arranged in plural steps in accordance with a first embodiment of the present invention. An IC package 28 contains a packaging material that encases at least one, but usually two, or more, chips such as chips 20 and 21 as well as a radiation plate 22 as shown. The chips 20 and 21 have external outputs which communicate with external terminals 25 and 26, as shown. In the case of chip 20, the external terminal 25 is connected to an interface on the chip 20 by way of a wire bond, as shown. In the case of chip 21, the external terminal 26 is electrically connected to the electrical interface on the chip 21 by way of an electric conductive adhesive. As seen, the electric conductive adhesive has a lower profile than that of the wire bond approach, thus enabling more chips to be included within a single IC package, without increasing a vertical size of the package. As shown, the chip 21 is held in the packaging material over the radiation plate 22 so as to maximize a thermal coupling, and thus the heat-sink effect to the chips. Furthermore, this placement of the radiation plate 22 directly beneath the chip 21 helps the radiation plate 22 minimize adverse noise affects within the IC package.

While the illustrative example of FIG. 1(*a*) shows the combination of wire bonding or electric, conductive adhesive, it is possible that the two or more chips in the IC package 28 may commonly use wire bonding, or may commonly use electric, conductive adhesive, or a combination of the two, such as that shown in FIG. 1(*a*), which shows chip 20 employing a wire bonding approach and chip 21 employing an electric, conductive adhesive approach.

As shown in the circled portion of FIG. 1(*a*), the external terminals 25, 26 and 27 are shown in a stepped configuration. External terminal 27 includes an electrically conductive material that connects on one end to the radiation plate by a physical connector, as shown which may be solder, direct bonding material, wire bonding, or electric, conductive adhesive or technically recognized equivalent structures. The shape of the external terminal 27 is shown to be a multisegmented terminal having a generally horizontal top portion that makes the connection to the radiation plate 22. An inclined portion extends from an opposite end of the top portion and continues down to a foot that is located in a common horizontal plane with a bottom of the IC package 28, as well as corresponding feet for external terminals 25 and 26 as shown. External terminal 26 has a somewhat similar shape as external terminal 27 in that it has a top horizontal portion that is electrically connected to the interface on the chip 21 and an inclined segment that extends from an opposite end of the top horizontal portion of external terminal 26 down to the foot segment. The top horizontal portion of external terminal 26 is longer than that of external terminal 27 primarily because the external terminal 26 extends further from the edge of the IC package 28 than the external terminal 27. Likewise, the top horizontal portion of the external terminal 25 extends to a further remote portion of the edge of the IC package 28. This is because the external terminal 25 ultimately attaches to a printed circuit board, or other substrate, at a location that is the most remote of the respective external terminals 25, 26 and 27. Likewise, the inclined segment of external terminal 26 is longer than that of external terminal 27, but shorter than the inclined segment of external terminal 25. As a consequence, the three-dimensional stepped architecture of the external terminals allows for a predetermined distance to separate the nearest-neighbor of external terminals 25, 26, 27 so as to maintain physical and electrical isolation between the respective external terminals.

Figure 2:
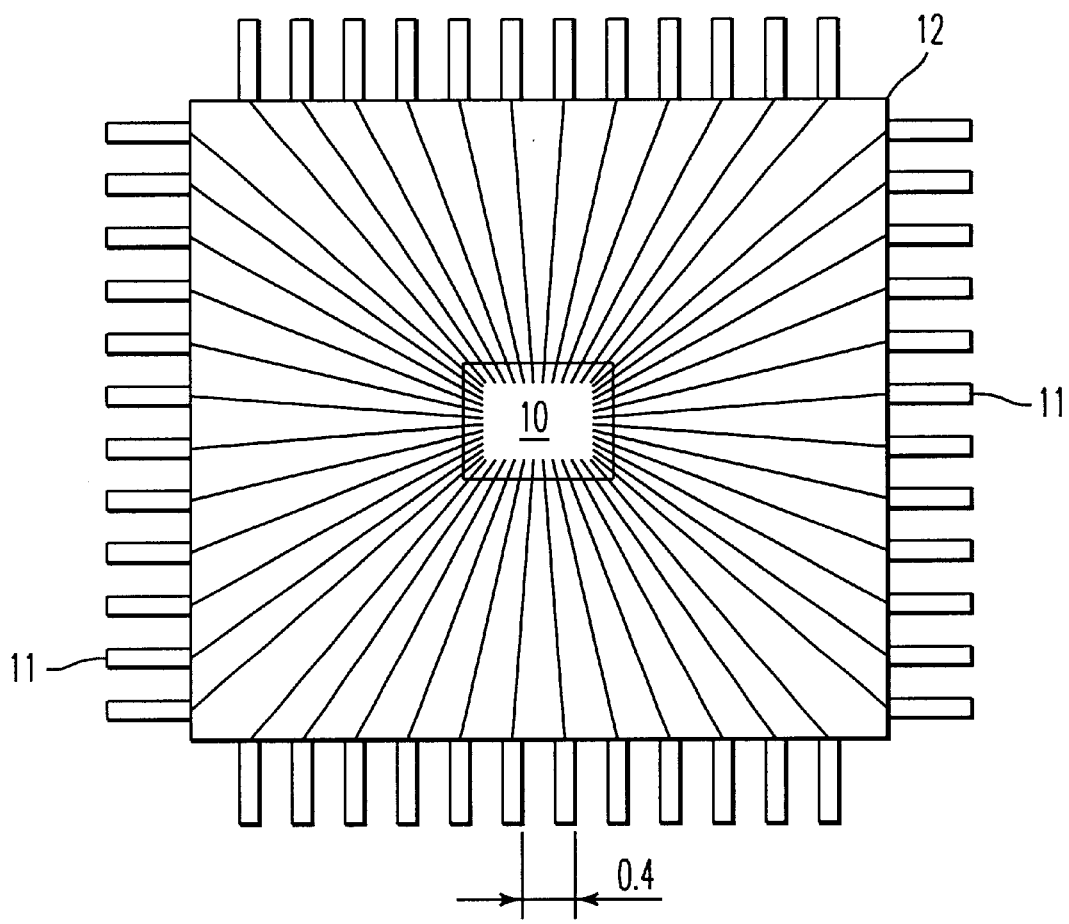
FIG. 2 is a sectional top view of a conventional IC package.

Because each of the external terminals 25, 26, 27 is arranged in the stacked, stepped architecture around the IC package 28 with a same pitch (separation between the respective pins themselves, as well as a separation and distance between respective sets of pins, like that shown in FIG. 2, for example) of less than or equal to 0.4 mm (although other spacings are possible), a side length of the package is about half of that of conventional device with the same number of external terminals. Moreover, a side of the mold body that makes the IC package is half of that of a conventional package and the other side (assuming a rectangular architecture, which includes a square architecture) is perhaps more than half of that of the conventional IC package. This discussion of size comparison will be further explained by way of example. In the case of the 3-stepped architecture of FIG. 1, although noting that other higher level steps are possible as well, such as four steps, in the case of three steps, a side size of the package is ⅓ of that of a conventional package for a corresponding number of pins. In a case of a chip or chips that require 500 pins, even if these chips are used with a radiation plate 22, the overall size of the IC package 28 is equal to a size of a conventional IC package for supporting 250 pins, and the area of the package is about ¼ of that of the conventional package size. However, because the sets of stepped terminals includes extending the length of the external terminals 25 with respect to terminals 27 for example, additional surface area is required when connecting the respective feet of the external terminals 25, 26 and 27 to the circuit board or other connecting substrate. As a result, one side size of the overall IC package is greater than half of that of the conventional package. Moreover, the one side size of the mold body is half, while the other side size of the package is more than half. Explaining this further, if the bottom external terminal 27 is actually connected with the radiation plate 22, in the case of three steps, the area of the IC package is shrunken between ⅓ to ¼ of that of the conventional package. However, in the case of four levels of external terminals, the area of the package is shrunken between ⅙ and ⅛ of that of the conventional package. In this way, if using such a package with external terminals with a same pitch and employing the multi-level stepped external terminal architecture around it, it is possible to reduce the size of the package and reduce a space required to support that package in whatever the application in which the IC package is used.

FIG. 1(*b*) is a perspective view of the external terminals 25, 26 and 27 as shown in FIG. 1(*a*). The feet of the external terminals 25, 26 and 27 project away from a center of the IC package 28 and considering that one side size includes both sides of the external terminals 25, 26 and 27, the size of the package 28 itself is from ⅓ to ¼ of the conventional size. However, because the size of the external terminals 25, 26 and 27 increases by a ratio of 3/2 relative to the conventional size, a total area occupied by the package 28 and the external terminals 25, 26 and 27 is from ½ to ⅓ of the conventional area. On the other hand, because the overall size of the package and the external terminals can accommodate stacking multiple chips 20 and 21, or even more chips, an efficiency of including the electric circuit chip in the package 28 is raised by a significant amount and further reduces the space restrictions for the amount of chip area employed within the overall packaging.

Since each electric circuit chip 20, 21 and the radiation plate 22 are connected with external terminals 25, 26 and 27 respectively by wire bonding 23 or electric, conductive adhesive 24, electric signals from the chips 20, 21 and heat from the radiation plate are transferred in an efficient manner. The radiation plate 22 becomes a plate that helps bear electric noise and thus noise problems can be reduced. Since the connection of the chips 20 and 21 to the plate 22 with the external terminals 25, 26 and 27 is a direct connection, manufacturing is relatively straightforward and can be performed using conventional techniques.

As discussed above, and in accordance with the above described structure, it is not necessary to make the size of the package larger for an even increasing number of pins, which is a feature that is of significant interest given the improvements in integrated circuit manufacturing processes. The present invention enables the reduction of overall package size and space required in order to support modern electric circuit chips having many external terminals. Because multiple electric circuit chips may be included in a single package, it is also possible to reduce further space requirements even more. Because each chip and radiation plate are connected with respect to external terminals, electric noise and heat are transferred to outside of the package in an efficient manner. Because the external terminals are connected by way of electric, conductive adhesive, it is possible to reduce the overall thickness of the package relative to conventional devices.

The present document is based on Japanese Priority Document JP 9-341085, filed in the Japanese Patent Office on Dec. 11, 1997, the entire contents of which being incorporated herein by reference.

While the above description provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims. To this end, clearly numerous modifications and variations of the present invention are possible in light of the above teachings. It is therefore to be understood that within the scope of the appended claims, the invention may be practiced otherwise than as specifically described herein.

What is claimed is:

1. An integrated circuit package configured to hold an electric circuit chip therein, comprising:

a plurality of external terminals arranged in subsets and being positioned with respect to one another at a same pitch; and a radiation plate configured to radiate heat and bear noise produced by said electronic circuit chip when disposed in said integrated circuit package, wherein respective of said external terminals in each subset being arranged with respect to one another in a stepped configuration and separated from one another by a predetermined distance and stacked in a common vertical direction when emerging from a side surface of said integrated circuit package; and at least one of said external terminals being connected to said radiation plate.

2. The IC package of claim 1, wherein:

said IC package includes a packaging material configured to hold therein said electric circuit chip and another electric circuit chip; and respective of said external terminals of each subset being held by the packaging material and each configured to attach to only one of said electric circuit chip and said another electric circuit chip.

3. The IC package of claim 2, wherein:

at least a portion of said external terminals of said subset being configured to be wire bonded to at least one of said electric circuit chip, said another electric circuit chip, and said radiation plate.

4. The IC package of claim 2, wherein:

at least a portion of said external terminals of said subset being configured to be connected with an electrically conductive adhesive to at least one of said electric circuit chip, said another electric circuit chip, and said radiation plate.

5. An IC package configured to hold an electric circuit chip therein, comprising:

a plurality of external terminals arranged in subsets, respective of said subsets being positioned with respect to one another at a predetermined pitch, external terminals of each of said subsets being arranged in a common vertical direction and separated from one another by a predetermined distance;

means for holding said plurality of external terminals in said subset in a predetermined fixed position;

means for connecting said electric circuit chip to at least one external terminal of said subset of external terminals;

means for suppressing heat radiation and noise generated by said electric chip; and means for connecting at least one of said plurality of external terminals to said means for suppressing heat radiation and noise.

6. The integrated circuit package of claim 2, wherein:

said packaging material is configured to hold said another electric circuit chip and said electric circuit chip on a same side of said radiation plate.

7. The IC package of claim 6, wherein:

said electric circuit chip is disposed between said radiation plate and said another electric circuit chip; and for each subset of external terminals, one external terminal that is configured to connect to said electric circuit chip being disposed between other external terminals in said subset that are configured to be connected to said another electric circuit chip and said radiation plate.

* * * * *